(12) United States Patent
Henri

(10) Patent No.: US 9,385,318 B1
(45) Date of Patent: Jul. 5, 2016

(54) METHOD TO INTEGRATE A HALIDE-CONTAINING ALD FILM ON SENSITIVE MATERIALS

(71) Applicant: Lam Research Corporation, Fremont, CA (US)

(72) Inventor: Jon Henri, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/811,205

(22) Filed: Jul. 28, 2015

(51) Int. Cl.
*H01L 21/31* (2006.01)
*H01L 45/00* (2006.01)

(52) U.S. Cl.
CPC ............ *H01L 45/1616* (2013.01); *H01L 45/06* (2013.01); *H01L 45/12* (2013.01); *H01L 45/1233* (2013.01); *H01L 45/141* (2013.01); *H01L 45/1675* (2013.01)

(58) Field of Classification Search
CPC ..... H01L 45/1616; H01L 45/12; H01L 45/06; H01L 45/1233; H01L 45/1675; H01L 45/141
See application file for complete search history.

(56) References Cited

U.S. PATENT DOCUMENTS

| | | | |
|---|---|---|---|
| 7,573,061 | B1 | 8/2009 | Yu et al. |
| 7,820,556 | B2 | 10/2010 | Hsu et al. |
| 7,955,990 | B2 | 6/2011 | Henri et al. |
| 8,298,628 | B2 | 10/2012 | Yang et al. |
| 8,728,956 | B2 | 5/2014 | LaVoie et al. |
| 2015/0093908 | A1 | 4/2015 | Reddy et al. |
| 2015/0093915 | A1 | 4/2015 | Reddy et al. |
| 2015/0287916 | A1* | 10/2015 | Campbell ............... H01L 45/16 257/5 |

OTHER PUBLICATIONS

Hudson et al., "Technique to Deposit Sidewall Passivation for High Aspect Ratio Cylinder Etch," filed May 28, 2015.
Hausmann, Dennis Michael, "Method of Conditioning Vacuum Chamber of Semiconductor Substrate Processing Apparatus," U.S. Appl. No. 14/446,427, filed Jul. 30, 2014.

* cited by examiner

*Primary Examiner* — Chuong A Luu
*Assistant Examiner* — Cory Eskridge
(74) *Attorney, Agent, or Firm* — Weaver Austin Villeneuve & Sampson, LLP

(57) ABSTRACT

Various embodiments herein relate to methods and apparatus for depositing a bilayer barrier layer on a substrate. The bilayer barrier layer may include a first sub-layer designed to protect underlying halide-sensitive layers from damaging halide-containing chemistry, as well as a second sub-layer designed to protect underlying materials from damage due to oxidation. In a number of embodiments the first sub-layer is layer having a high carbon content, and the second layer is silicon nitride. The silicon nitride second sub-layer may be deposited with halide-containing chemistry that would otherwise damage halide-sensitive materials, if not for the presence of the first sub-layer. The resulting bilayer barrier layer provides high quality protection for underlying materials.

19 Claims, 12 Drawing Sheets

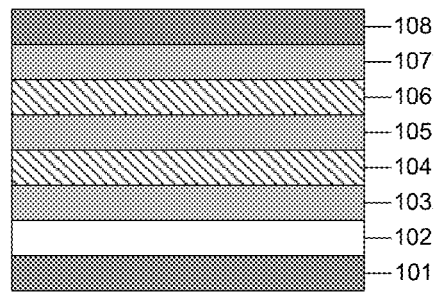
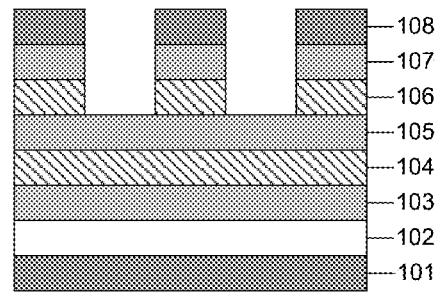
FIG. 2A                   FIG. 2B
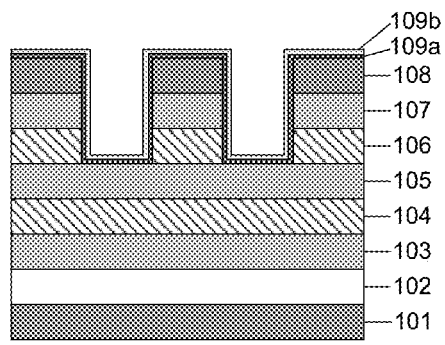
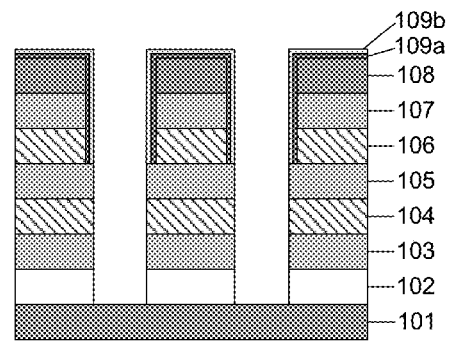
FIG. 2C                   FIG. 2D
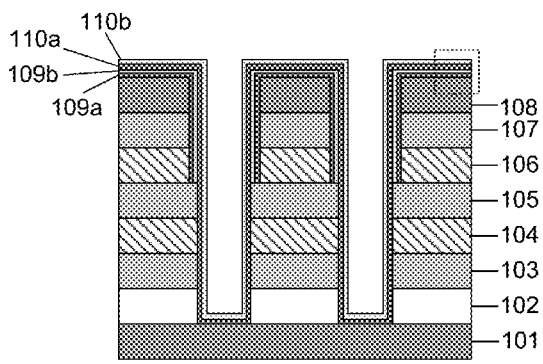
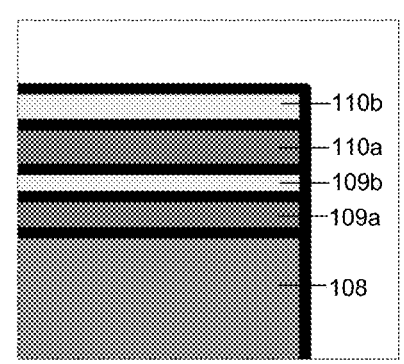
FIG. 2E                   FIG. 2F

| Sample | Leakage Current | | | Breakdown Voltage (MV/cm) |
|---|---|---|---|---|
| | @ 1 MV/cm | @ 2 MV/cm | @ 4 MV/cm | |
| 1 | 1.8E-8 | 3.3E-7 | 7.0E-4 | -4.2 |
| 2 | 4.2E-9 | 6.6E-8 | 1.2E-4 | -4.8 |
| 3 | 4.2E-9 | 6.6E-8 | 1.2E-4 | -4.6 |
| 4 | 5.9E-10 | 3.9E-7 | 5.7E-4 | -4.4 |

METHOD TO INTEGRATE A HALIDE-CONTAINING ALD FILM ON SENSITIVE MATERIALS

BACKGROUND

Various semiconductor devices are fabricated to include barrier layers. A barrier layer may be provided to protect materials within the device, for example to prevent damage arising from exposure to atmosphere and/or exposure to other layers or processes during fabrication. Such barrier layers can delay or prevent degradation of the semiconductor device.

SUMMARY

Various embodiments herein relate to methods and apparatus for depositing a bilayer barrier layer on a partially fabricated semiconductor device. The bilayer barrier layer typically includes at least two sub-layers. The first sub-layer may protect the underlying material from damage related to exposure to halides or other harmful chemistry used to deposit the second sub-layer. The second sub-layer may protect the underlying materials against oxidation. This bilayer approach helps ensure that the underlying materials are adequately protected throughout fabrication.

In one aspect of the disclosed embodiments, a method of depositing a bilayer barrier layer on a partially fabricated semiconductor device is provided, the method including: (a) providing a substrate including a first layer of halide-sensitive material, the first layer of halide-sensitive material being at least partially exposed when provided in (a); and (b) depositing the bilayer barrier layer by: (i) depositing a first sub-layer of the bilayer barrier layer on the substrate, the first sub-layer including at least about 40 weight % carbon, the first sub-layer of the bilayer barrier layer being deposited on exposed portions of the first layer of halide-sensitive material, and (ii) depositing a second sub-layer of the bilayer barrier layer on the first sub-layer of the bilayer barrier layer, the second sub-layer of the bilayer barrier layer including silicon nitride, where the second sub-layer of the bilayer barrier layer is deposited using halide-containing chemistry, where during deposition of the second sub-layer of the bilayer barrier layer, the first sub-layer of the bilayer barrier layer protects the first layer of halide-sensitive material from the halide-containing chemistry.

The method may be performed in the context of forming a phase change random access memory (PCRAM) device in some cases. In certain embodiments, the first layer of halide-sensitive material includes a chalcogenide material. The chalcogenide material may be sandwiched between layers of carbon.

In these or other embodiments, the first sub-layer of the bilayer barrier layer may include amorphous carbon deposited through a chemical vapor deposition process. In some other embodiments, the first sub-layer of the bilayer barrier layer may include a parylene material deposited through a process involving pyrolysis and polymerization. One example of the parylene material is parylene AF-4.

Various techniques may be used to deposit the second sub-layer of the bilayer barrier layer. In one example, (c) includes depositing the second sub-layer of the bilayer barrier layer through an atomic layer deposition process. In another example, (c) includes depositing the second sub-layer of the bilayer barrier layer through a chemical vapor deposition process. In a particular example, the substrate includes a second layer of halide-sensitive material positioned below the first layer of halide-sensitive material, and the method further includes: (d) after (c), etching the substrate in a manner that exposes portions of the second layer of halide-sensitive material but not the first layer of halide-sensitive material, the first layer of halide-sensitive material remaining covered at least partially by the bilayer barrier layer; (e) depositing a second bilayer barrier layer on the substrate by: (i) depositing a first sub-layer of the second bilayer barrier layer on the substrate, the first sub-layer of the second bilayer barrier layer including at least about 40 weight % carbon, the first sub-layer of the second bilayer barrier layer being deposited on exposed portions of the second layer of halide-sensitive material, and (ii) depositing a second sub-layer of the second bilayer barrier layer on the first sub-layer of the second bilayer barrier layer, the second sub-layer of the second bilayer barrier layer including silicon nitride, where the second sub-layer of the second bilayer barrier layer is deposited using halide-containing chemistry in an atomic layer deposition process, where during deposition of the second sub-layer of the second bilayer barrier layer, the first sub-layer of the second bilayer barrier layer protects the second layer of halide-sensitive material from the halide-containing chemistry.

In some embodiments, the first sub-layer of the bilayer barrier layer may be deposited to a thickness between about 15-100 Å thick, and the second sub-layer of the bilayer barrier layer may be deposited to a thickness of at least about 20 Å.

The halide-containing chemistry may include chlorine in some cases. For example, the halide-containing chemistry may include a chlorosilane. In one example the chlorosilane is dichlorosilane. The dichlorosilane may be used in combination with a nitrogen-containing reactant. One example nitrogen-containing reactant is ammonia.

In certain embodiments, the first sub-layer of the bilayer barrier layer is formed through a plasma enhanced chemical vapor deposition process that involves exposing the substrate to a plasma, the plasma being generated using a single RF frequency. The RF frequency used to generate the plasma may be a high frequency (HF) RF frequency. The first and second sub-layers may be deposited in the same reaction chamber or in different reaction chambers. In one implementation, the first sub-layer of the bilayer barrier layer is deposited in a reaction chamber, and where the second sub-layer of the bilayer barrier layer is deposited in the same reaction chamber. In another implementation, the first sub-layer of the bilayer barrier layer is deposited in a first reaction chamber and the second sub-layer of the bilayer barrier layer is deposited in a second reaction chamber, the first and second reaction chambers being provided together on a multi-chamber tool. In this case, the method may further include transferring the substrate from the first reaction chamber to the second reaction chamber under vacuum conditions.

In a number of cases, the first and second sub-layers of the bilayer barrier layer are conformally deposited. In some cases, for each of the first and second sub-layers, the thinnest portion of the sub-layer is at least about 60% the thickness of the thickest portion of the sub-layer.

In another aspect of the disclosed embodiments, an apparatus for depositing a bilayer barrier layer on a partially fabricated semiconductor device is provided, the apparatus including: one or more reaction chambers, at least one of which is configured to deposit a first sub-layer of the bilayer barrier layer and at least one of which is configured to deposit a second sub-layer of the bilayer barrier layer, the reaction chamber(s) including: an inlet for providing process gas, and an outlet for removing process gas and byproducts; and a controller configured to deposit the bilayer barrier layer by: (i) depositing the first sub-layer of the bilayer barrier layer on the substrate, the first sub-layer including at least about 40 weight % carbon, the first sub-layer of the bilayer barrier layer being deposited on exposed portions of a first layer of halide-sensitive material, and (ii) depositing the second sub-layer of the bilayer barrier layer on the first sub-layer of the bilayer barrier layer, the second sub-layer of the bilayer barrier layer including silicon nitride, where the second sub-layer of the bilayer barrier layer is deposited using halide-containing chemistry, where during deposition of the second sub-layer of the bilayer barrier layer, the first sub-layer of the bilayer barrier layer protects the first layer of halide-sensitive material from the halide-containing chemistry.

In one example, the reaction chamber configured to deposit the first sub-layer of the bilayer barrier layer is the same reaction chamber configured to deposit the second sub-layer of the bilayer barrier layer. In this case, the apparatus may further include a vacuum transfer chamber for transferring the substrate between a first reaction chamber and a second reaction chamber under vacuum conditions, where the first reaction chamber is configured to deposit the first sub-layer of the bilayer barrier layer and the second reaction chamber is configured to deposit the second sub-layer of the bilayer barrier layer.

In yet a further aspect of the disclosed embodiments, a method of depositing a bilayer barrier layer on a substrate having recessed features thereon is provided, the method including: (i) depositing a first sub-layer of the bilayer barrier layer on the substrate, the first sub-layer of the bilayer barrier layer including amorphous carbon or a carbon-containing polymer, the first sub-layer of the bilayer barrier layer including at least about 40 weight % carbon, where the first sub-layer is deposited conformally to line the recessed features; and (ii) depositing a second sub-layer of the bilayer barrier layer on the first sub-layer of the bilayer barrier layer, the second sub-layer of the bilayer barrier layer including silicon nitride, where the second sub-layer of the bilayer barrier layer is deposited conformally using halide-containing chemistry, and where during deposition of the second sub-layer of the bilayer barrier layer, the first sub-layer of the bilayer barrier layer protects materials underlying the first sub-layer of the bilayer barrier layer from the halide-containing chemistry.

These and other features will be described below with reference to the associated drawings.

BRIEF DESCRIPTION OF THE DRAWINGS

FIGS. 2A-2F depict cross-sectional views of a partially fabricated device in the context of forming a PCRAM device according to certain embodiments.

DETAILED DESCRIPTION

Figure 1A:
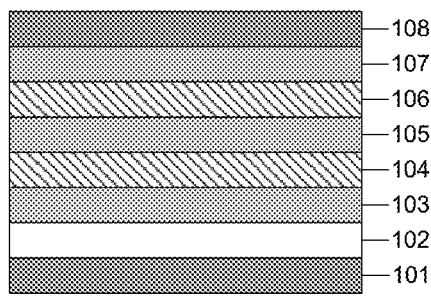
FIGS. 1A-1E depict cross-sectional views of a partially fabricated device in the context of forming a phase change random access memory (PCRAM) device.

In this application, the terms "semiconductor wafer," "wafer," "substrate," and "semiconductor substrate" are used interchangeably. Reference is also made to "partially fabricated semiconductor devices." One of ordinary skill in the art would understand that the term "partially fabricated semiconductor device" can refer to a semiconductor device wafer during any of many stages of fabrication thereon. A wafer or substrate used in the semiconductor device industry typically has a diameter of 200 mm, or 300 mm, or 450 mm. The following detailed description assumes the embodiments are implemented on a work piece that is a semiconductor wafer. However, the embodiments are not so limited. The work piece may be of various shapes, sizes, and materials. In addition to semiconductor wafers, other work pieces that may take advantage of the disclosed embodiments include various articles such as printed circuit boards, magnetic recording media, magnetic recording sensors, mirrors, optical elements, micro-mechanical devices and the like. Similarly, while the description below refers chiefly to phase change random access memory (PCRAM) devices, the embodiments are not so limited. Other devices may take advantage of the disclosed embodiments, including any partially fabricated device that is susceptible to damage from halide-containing chemistries.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Many semiconductor devices include materials that are sensitive to oxidation. Such materials may quickly degrade if exposed to an oxygen-containing or water vapor-containing atmosphere. In order to prevent such degradation, these materials are frequently covered with a barrier layer. The barrier layer blocks the passage of oxidants such that the underlying oxidation sensitive material does not become oxidized.

One material that has been used as a barrier layer is silicon nitride (SiN). As used herein, the term silicon nitride is understood to include both doped and undoped forms of silicon nitride, as well as stoichiometric and non-stoichiometric forms of silicon nitride. For instance, the film may in some cases be a silicon carbonitride film, a silicon oxynitride film, etc. In various contexts, SiN is desirable as a barrier layer material because it is non-conductive and because it functions very well to block passage of oxidants. Further, SiN can be deposited via atomic layer deposition (ALD) reactions, including plasma enhanced atomic layer deposition reactions (PEALD). As such, it can be deposited with a high degree of conformality in high aspect ratio features (e.g., features having a depth/width aspect ratio of at least about 10). In various embodiments herein that are performed in the context of forming a phase change random access memory (PCRAM device, the recessed features may have an aspect ratio of at least about 10. In many cases the aspect ratio of the recessed features is on the order of about 15. Example critical dimensions (e.g., widths) of such features may be on the order of about 300 Å, for example between about 200-400 Å.

However, SiN (particularly ALD deposited SiN) is typically deposited using halide-containing chemistry. In many cases, SiN is deposited using dichlorosilane (DCS, $H_2SiCl_2$) as one of the reactants. For example, DCS may react with ammonia ($NH_3$) to form a layer of SiN. Unfortunately, this halide-containing chemistry can attack and degrade certain halide-sensitive materials present in the partially fabricated semiconductor device. As used herein, a halide-sensitive material is one that degrades (e.g., reacts undesirably) when exposed to halide-containing chemistry.

Chalcogenide materials provide one example of a class of materials that is sensitive to halides. Chalcogenide materials (e.g., chalcogenide glass, for instance GeSbTe and AgInSbTe) can be used to fabricate phase change memory devices. When a SiN barrier layer is deposited on a chalcogenide material using the chemistry mentioned above, HCl formed from the reaction between the DCS and $NH_3$ can attack and degrade the exposed chalcogenide material.

FIGS. 1A-1E present cross-sectional views of a partially fabricated PCRAM semiconductor device during various fabrication steps. As shown in FIG. 1A, a stack of materials is deposited on an underlying layer, which in this example is an oxide layer 101. The stack of materials in this example includes a metal layer 102 (e.g., tungsten or another metal), a first carbon layer 103, a first chalcogenide layer 104, a second carbon layer 105, a second chalcogenide layer 106, a third carbon layer 107, and a nitride cap layer 108. The metal layer 102 acts as an electrical contact layer. The chalcogenide layers 104 and 106 are the layers that undergo a phase change during operation of the device. The carbon layers 103, 105, and 107 prevent the chalcogenide layers 104 and 106 from interfering with one another, and also provide an electrical path used to cause the chalcogenide layers 104 and 106 to change phase.

Figure 1B:
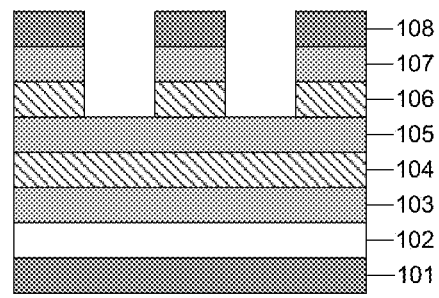
Figure 1C:
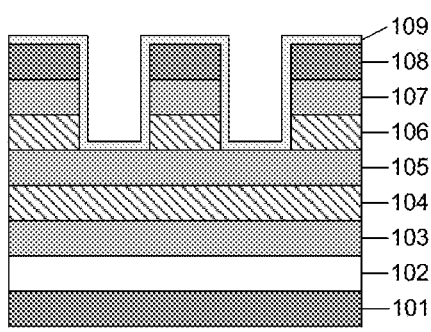
Figure 1D:
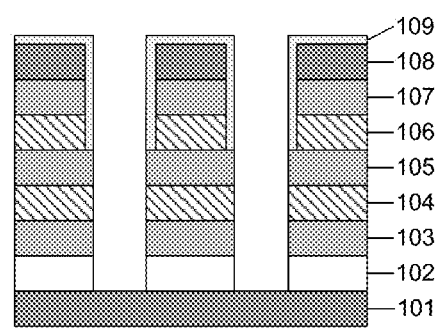
Figure 1E:
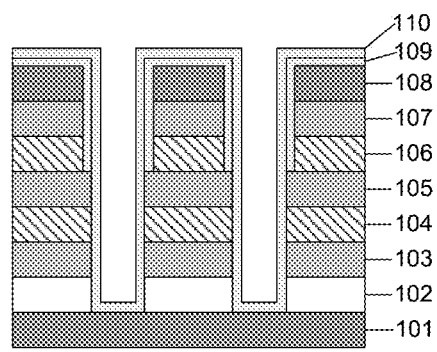

During processing, recessed features are partially etched into the stack, as shown in FIG. 1B. This etching process may etch through a portion of the stack, including through the second chalcogenide layer 106. Next, as shown in FIG. 1C, a first silicon nitride barrier layer 109 is deposited. This first silicon nitride barrier layer 109 may help protect the second chalcogenide layer 106 as the stack is further etched. For example, as shown in FIG. 1D, the process continues with a second etching process to further etch the stack down to the oxide layer 101. If the first silicon nitride barrier layer 109 were not deposited, etching byproducts from one chalcogenide layer (e.g., chalcogenide layer 104) could re-deposit on the other chalcogenide layer (e.g., chalcogenide layer 106), causing contamination/defects. After the stack is etched as shown in FIG. 1D, a second silicon nitride barrier layer 110 may be deposited as shown in FIG. 1E. An insulating film (not shown) may be deposited in the etched recesses. The insulating film may be an oxide such as silicon oxide, spin on glass, etc.

The first and second SiN barrier layers 109 and 110 help protect underlying layers from contamination and oxidation. In particular, the SiN barrier layers provide very good protection against oxidation during subsequent integration steps, for example when the recesses are filled with oxide material. In order to function as a good barrier layer in the PCRAM context, it is advantageous for the barrier layer material to (a) be deposited at a low temperature (e.g., about 250° C. or below), (b) exhibit good step coverage/conformality such that the material is deposited relatively uniformly in high aspect ratio features, (c) provide good resistance to oxidation, (d) minimize cross-contamination of the chalcogenide layers, (e) provide good control over the critical dimension of the recessed features, (f) be non-conductive, and (g) provide good adhesion to underlying layers. Generally speaking, SiN barrier layers exhibit these qualities. However, the first and/or second silicon nitride barrier layers 109 and 110 are typically deposited using halide-containing chemistry, as discussed above. Often the halide is chlorine (e.g., provided as dichlorosilane, also referred to as DCS), though other halides may be used in some cases. The halide chemistry reacts with other reactants (e.g., ammonia) to form species (e.g., HCl) that undesirably attack and degrade the chalcogenide layers 104 and 106.

Bilayer Barrier Layer

In various embodiments herein, a barrier layer may be deposited as two sub-layers. The two sub-layers may together be referred to as a bilayer. A first sub-layer of the barrier layer may be optimized such that (a) the first sub-layer can be deposited without attacking/degrading the layers in the stack, and (b) the first sub-layer protects the layers in the stack (particularly the first and/or second chalcogenide layers 104 and 106) from halide chemistry present when depositing the second sub-layer. The second sub-layer of the barrier layer may be optimized such that it provides a high quality barrier against oxidation. In this way, the stack materials can be protected against degradation arising from both oxidation and chemistry used to deposit the oxidation barrier (e.g., SiN).

FIGS. 2A-2E present cross-sectional views of a partially fabricated PCRAM structure during various fabrication operations according to certain embodiments. FIG. 2F presents a close up view of a portion of FIG. 2E. In this embodiment, a stack of materials is deposited on an underlying layer, which in this example is an oxide layer 101. The stack includes a metal layer 102 (e.g., tungsten or another metal), a first carbon layer 103, a first chalcogenide layer 104, a second carbon layer 105, a second chalcogenide layer 106, a third carbon layer 107, and a nitride cap layer 108. The stack in FIG. 2A is identical to the one shown in FIG. 1A. As shown in FIG. 2B, the stack is partially etched in a first etching operation. A first barrier layer may then be deposited, as shown in FIG. 2C. Here, the first barrier layer includes two sub-layers 109a and 109b. The first sub-layer 109a of the first barrier layer may be a first material (e.g., a carbon material such as amorphous carbon, parylene, or other non-conductive/high carbon content materials), and the second sub-layer 109b of the first barrier layer may be a second material (e.g., SiN or another material that provides good protection against oxidation and good adhesion to the first sub-layer).

Next, the recessed features may be further etched as shown in FIG. 2D. After the stack is etched and the underlying oxide layer 101 is exposed, a second barrier layer may be deposited, as shown in FIG. 2E. Like the first barrier layer, the second barrier layer may be composed of two sub-layers. The first sub-layer 110a of the second barrier layer may be a first material (e.g., a carbon material such as amorphous carbon, parylene, or other non-conductive/high carbon content materials), and the second sub-layer 110b of the second barrier layer may be a second material (e.g., SiN or another material that provides good protection against oxidation and good adhesion to the first sub-layer). The first sub-layer 109a of the first barrier layer may be the same or different material as the first sub-layer 110a of the second barrier layer. Likewise, the second sub-layer 109b of the first barrier layer may be the same or different material as the second sub-layer 110b of the second barrier layer.

The upper corner of FIG. 2E shows a dotted box. This portion of the figure is shown in close-up view in FIG. 2F. In the example shown in FIGS. 2A-2F, each of the first and second barrier layers are implemented as two sub-layers. The two sub-layers may also be referred to as a bilayer. In some embodiments, only a single barrier layer may be implemented as two sub-layers. With reference to FIG. 1E, in some embodiments the first barrier layer 109 may be a single layer while the second barrier layer 110 is a bilayer. In other embodiments, the first barrier layer 109 may be a bilayer while the second barrier layer 110 is a single layer. Barrier layers that are fabricated to include ALD-deposited SiN may be particularly suitable for fabrication using the bilayer techniques disclosed herein, especially where the barrier layer is deposited over a material that is sensitive to halide-containing chemistry. However, the techniques described herein are not limited to this context.

While FIGS. 1A-1E and 2A-2F are presented in the context of forming a PCRAM device, the embodiments are not so limited. The techniques described herein are useful in a number of different contexts. Generally speaking, the embodiments are useful in applications where it is desired to protect an underlying layer from damage due to exposure to halide-containing chemistry (e.g., chlorine-containing chemistry that results in exposure of a substrate to harmful species such as HCl). In addition to the chalcogenide materials described above, other examples of halide-sensitive materials include, but are not limited to, copper film and aluminum film. The first sub-layer of the bilayer provides protection against damage from halide-containing chemistry (e.g., HCl). This first sub-layer is sometimes referred to as a halide block layer, or more specifically as an HCl block layer. The second sub-layer of the bilayer provides protection against oxidation such that the underlying materials do not become oxidized. These sub-layers work together to provide high quality/multi-purpose protection to the underlying layers.

While many of the embodiments herein are presented in the context of a barrier layer that includes two sub-layers implemented as a bilayer, it should be understood that additional sub-layers may be present in some cases. An additional barrier layer sub-layer may be provided between the two sub-layers described herein, or outside of such layers (e.g., under or over both sub-layers described herein). The two sub-layers described herein are often, but not necessarily, in direct physical contact with one another.

Material of Sub-Layers in Bilayer Barrier Layer

As noted above, the sub-layers described herein are provided for different purposes. In order to accomplish these different purposes, the sub-layers may be made of different materials. Typically, the first sub-layer (which may be deposited directly on materials that are sensitive to damage from HCl or other halide-containing chemistry) is made of a material that provides a high quality barrier to HCl and/or other harmful halide-containing chemistry. The second sub-layer (which may be deposited over the first sub-layer) is typically made of a material that provides a high quality barrier to oxidation. The material chosen for the first and/or second sub-layer may exhibit certain additional qualities such as low deposition temperature (e.g., about 250° C. or less), and high quality step coverage and conformality for covering high aspect ratio trenches. With respect to conformality, in a number of cases the thinnest portion of a sub-layer may be at least about 60% the thickness of the thickest portion of the sub-layer, as measured on the sidewalls of a recessed feature. The first and/or second sub-layers are typically made of materials that are electrically insulating.

With respect to the first sub-layer, materials that have a high carbon content have been shown to provide a high quality barrier to halide chemistry such as HCl. As such, in many embodiments the first sub-layer of a barrier layer is made of a material having a high carbon content. In some cases, the material of the first barrier layer may be at least about 40 wt % carbon, for example at least about 99 wt % carbon. One class of materials that may be appropriate for use as the first sub-layer is ashable hardmask (AHM) materials. Example AHM materials include amorphous carbon materials composed primarily of carbon, with the remainder typically being hydrogen and in some cases including trace amounts of other elements such as nitrogen.

In some other cases the material of the first sub-layer may be a parylene material. Parylene refers to a variety of organic polymers that are typically deposited through vapor deposition techniques. There are a number of different kinds of parylenes that may be useful as a material for the first sub-layer, including, but not limited to, parylene AF-4 and parylene N. Other high carbon materials that may be used for the first sub-layer in various embodiments include, but are not limited to, polynaphthalene-N, polynaphthalene-F, fluorinated amorphous carbon, fluorinated hydrocarbons, Teflon-AF, and thermally deposited fluorocarbons (e.g., CVD fluorocarbons). High carbon content films such as those listed herein have been shown to provide a high quality barrier to damaging halide chemistry such as HCl.

In certain implementations, the first sub-layer may be an organic or organometallic polymeric material. Various polymeric materials have been shown to provide a high quality HCl barrier. In many cases, the first sub-layer is deposited without using halide-containing chemistry. Similarly, the first sub-layer may be deposited using reactants/conditions that do not oxidize the underlying materials. In various embodiments, the first sub-layer may be deposited without exposing the substrate to an oxidizing or hydrogen-based plasma.

The material of the second sub-layer should provide good protection against oxidation of the underlying materials. One material that has been shown to provide high quality oxidation protection is SiN. SiN is also useful because it can be deposited conformally and at a relatively low temperature. SiN is particularly relevant as a second sub-layer material because it may be deposited using halide-containing chemistry that can damage materials underlying the first sub-layer.

While many of the embodiments herein are provided in the context of bilayer barrier layer having SiN as the second sub-layer, this is not necessarily the case. The material of the second sub-layer may be any non-conductive material that provides good protection against oxidation. Often the second sub-layer is a material that is deposited using halide-containing (e.g., chlorine-containing) chemistry. In various cases the second sub-layer may be deposited using chemistry that results in exposure of the substrate to damaging chemistry such as HCl. In the case of SiN (e.g., ALD-deposited SiN in many cases), deposition of the SiN material may involve exposure of the substrate to dichlorosilane and ammonia, which may react with one another to form HCl. Additional examples of materials that may be used for the second sub-layer include, but are not limited to SiCN and SiC. These materials may be deposited using chemistry (e.g., hydrogen plasma) that is damaging to the materials underlying the first sub-layer. However, the first sub-layer can protect the underlying materials during deposition of the second sub-layer.

Formation of First Sub-Layer in Bilayer Barrier Layer

The first sub-layer in the bilayer barrier layer is typically a high carbon material, as described above. The first sub-layer is generally deposited using a vapor deposition technique. A few different methods will be described.

Figure 5:
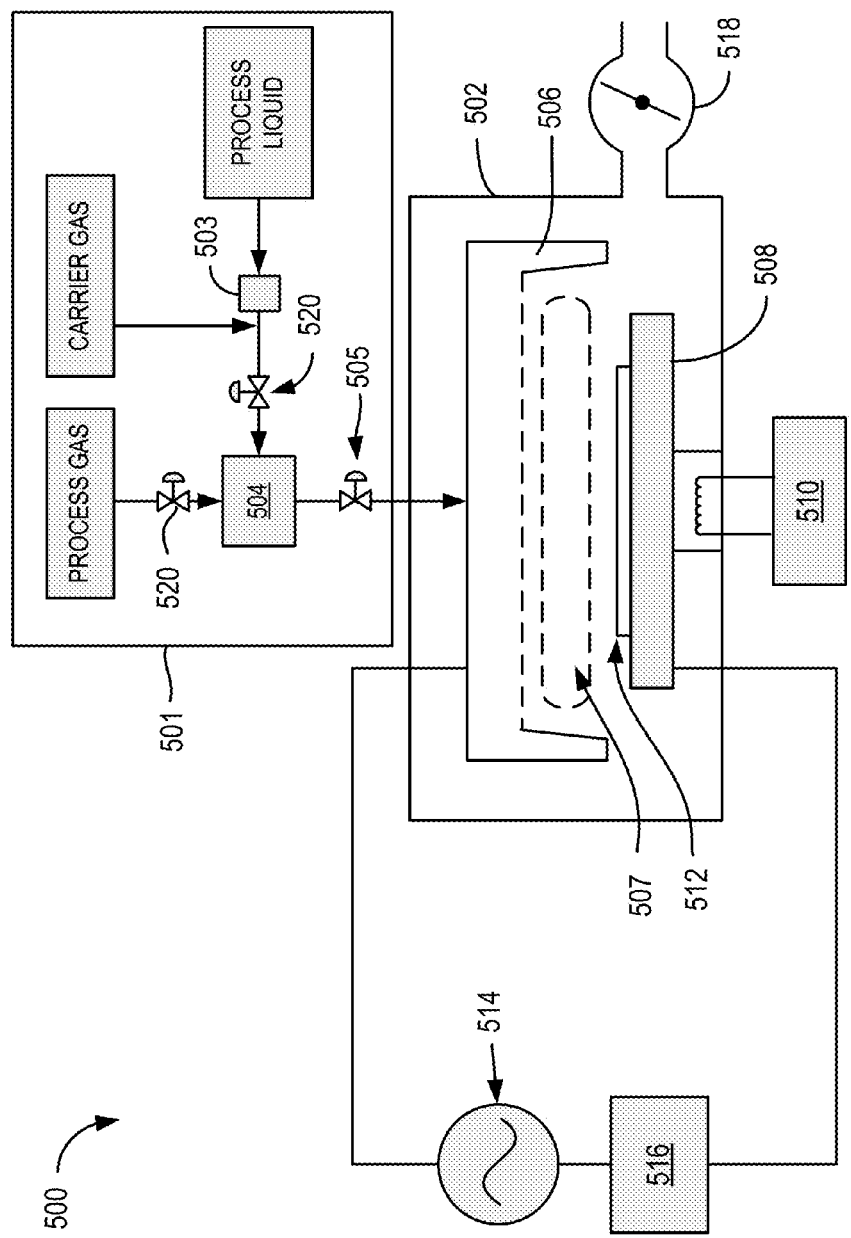
FIG. 5 illustrates a simplified view of a single station reaction chamber that may be used to carry out various vapor deposition methods described herein.
Figure 6:
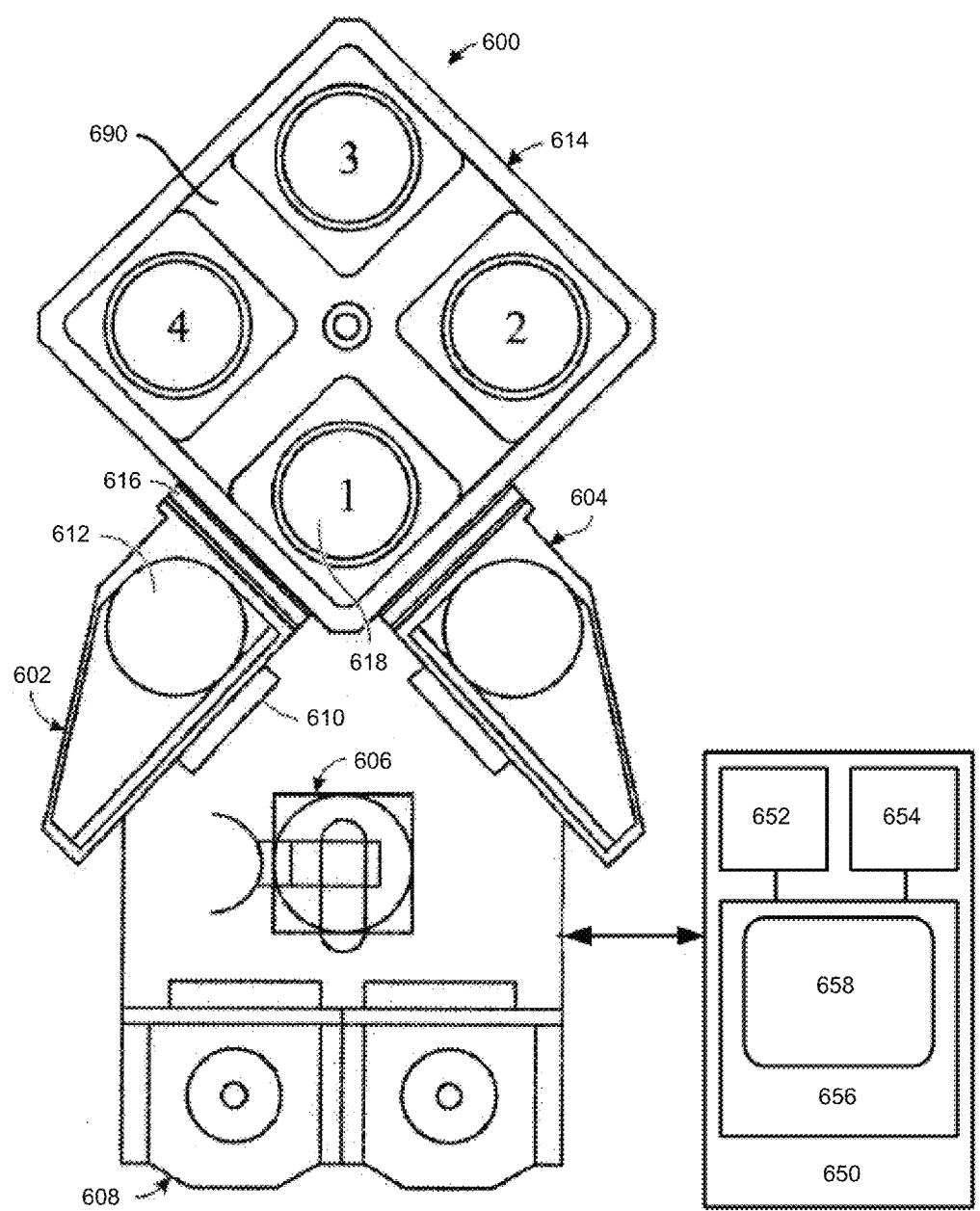
FIG. 6 illustrates a simplified view of a multi-station reaction chamber that may be used to carry out various vapor deposition methods described herein.
Figure 7:
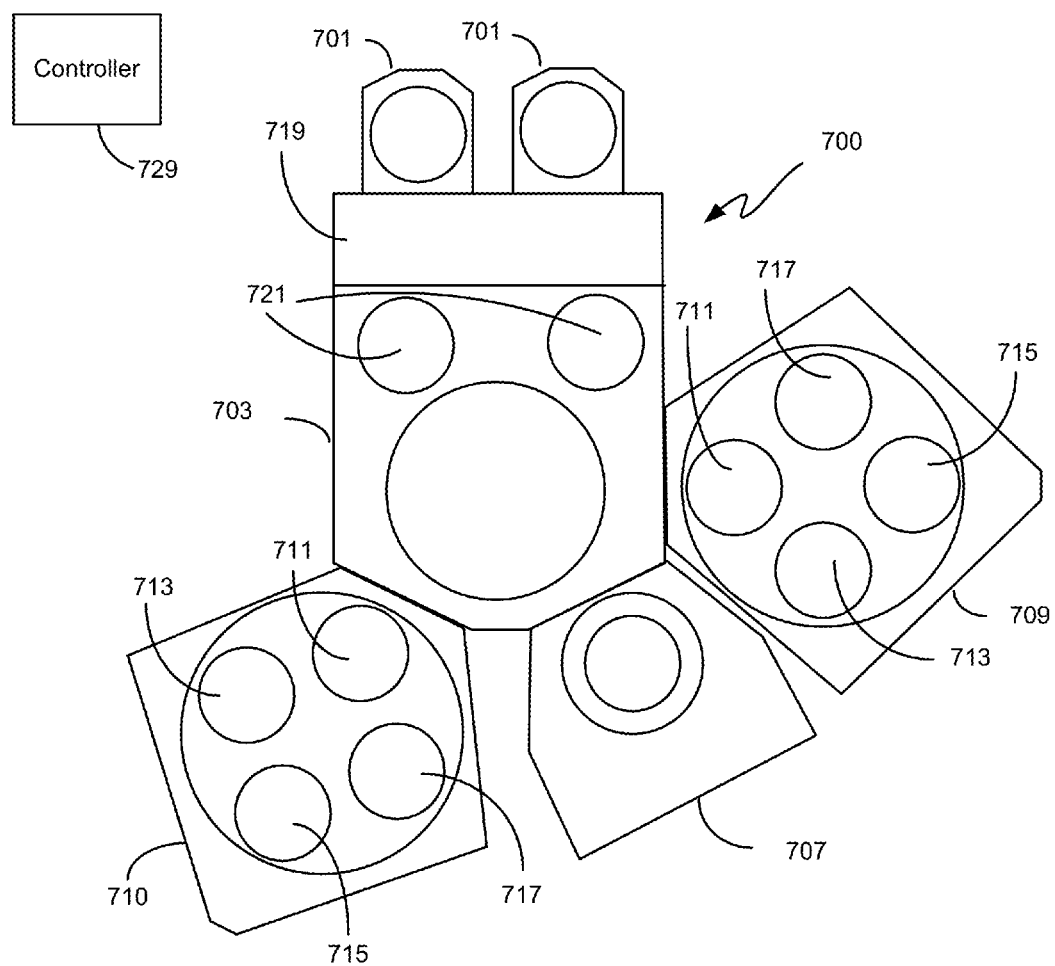
FIG. 7 depicts a simplified view of a cluster tool having multiple reaction chambers according to certain embodiments herein.

Many of the process parameters listed herein correspond to a Vector™ module (available from Lam Research Corporation of Fremont, Calif.) having four stations for depositing material on a 300 mm wafer. FIGS. 5-7, further described below, present examples of suitable apparatus for performing the method shown in FIG. 3A. One skilled in the art will readily appreciate that the process parameters may be scaled based on the deposition chamber volume, wafer size, and other factors. For example, power outputs of LF and HF generators are typically directly proportional to the deposition surface area of the wafer. The power used on 300 mm wafer is generally 2.25 higher than the power used for 200 mm wafer. Similarly, flow rates depend on the free volume of the deposition chamber, which is 195 L for each of four Novellus Vector™ deposition chambers.

Figure 3A:
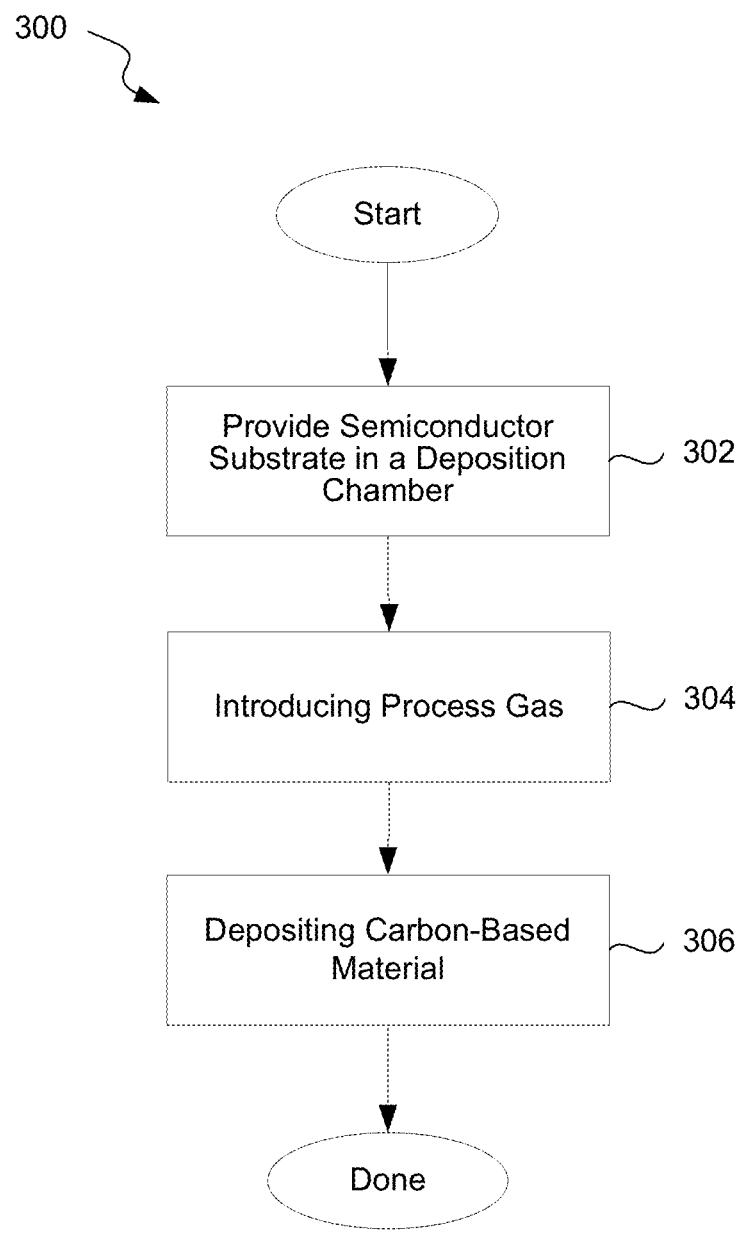
FIG. 3A illustrates a flowchart for a method of depositing a high carbon content material that may be used as a first sub-layer of a bilayer barrier layer according to various embodiments.

FIG. 3A illustrates stages in a general process flow for forming a high carbon content material in accordance with certain embodiments. The high carbon content material may be a material commonly used as an ashable hardmask material. This high carbon content material may form the first sub-layer of a bilayer barrier layer as disclosed herein. Ashable hardmask materials are carbon-based films commonly used as etch masks. In various embodiments, hardmask materials are amorphous carbon-based films. In the depicted embodiment, the method 300 begins with providing a semiconductor substrate in a deposition chamber (block 302). For example, a semiconductor substrate could be a 300 mm semiconductor wafer suitable for a Vector™ module. A precursor process gas is then introduced into the chamber (block 304). In certain examples the precursor process gas includes at least acetylene. Other examples of precursor gases include methane, propylene, and other hydrocarbons (e.g., $C_xH_y$, where $2<x<4$ and $2<y<10$).

Depending on deposition chamber size and other process parameters the flow rate of the acetylene may be about 3,000-10,000 sccm during the deposition process. In one embodiment, the flow rate of the acetylene may be about 5,000-8,000 sccm. As noted above, the process gas may also include other carbon containing precursors, such as methane, ethylene, propylene, butane, cyclohexane, benzene and toluene, and others.

A carrier gas may be used to dilute the precursor. The carrier gas may include any suitable carrier gas employed in semiconductor processing, such as helium, argon, nitrogen, hydrogen, or a combination of these. The overall carrier gas flow rate may depend on deposition chamber size and other process parameters and may range from about 500-10,000 sccm. In a specific embodiment, nitrogen and helium are used as carrier gases having corresponding flow rates ranges of about 500-5,000 sccm and about 300-3,000 sccm.

In the depicted embodiment, a high carbon content material is then deposited on the semiconductor substrate by a plasma enhanced chemical vapor deposition (PECVD) or other deposition processes (block 306). For example, in a single-frequency plasma generation process, a high frequency generator may provide between about 1000-3000 W, or between about 1500-2500 W, in one example about 2000 W at about 2-60 MHz (e.g., between about 7-13.56 MHz in some cases) during the deposition process. This power is delivered among four stations/substrates. This power may correspond to a power density between about 3500-11000 $W/m^2$ (considering the setpoint power and the area of the substrate(s)). This may correspond to a received power density between about 500-4400 $W/m^2$ (after considering power efficiency/delivery to the substrate). One example frequency is 13.56 MHz. Power efficiency is typically between about 70-80% with respect to the setpoint power. In one example, about 70-80% of input power is transported to the showerhead/pedestal by ion bombardment, while the rest is consumed to sustain the plasma and heat up gases. The deposition process may be performed when substrate temperature is between about 50-400° C. The pressure of the deposition chamber may be maintained at about 2-8 Torr. One example of process conditions for high carbon content material deposition is summarized in Table 1. Deposition is continued until the desired thickness of film is deposited. According to various embodiments, the first sub-layer may be deposited to a thickness between about 15-100 Å, for example between about 20-50 Å. Example deposition rates in some cases may be on the order of about 20 Å/min.

TABLE 1

| Parameter | Typical Process Range for a 4-station chamber |
|---|---|
| $C_2H_2$ Flow Rate | 1,000-10,000 sccm |
| $N_2$ Flow Rate | 0-5,000 sccm |
| He Flow Rate | 0-3,000 sccm |
| $H_2$ Flow Rate | 0-10,000 sccm |
| HF Power at Frequency | 1000-3000 W at 7-13.56 MHz |
| Pressure | 2-8 Torr |
| Temperature | 50-400° C. |
| Total Deposited Thickness | 15-100 Å |

All of the above process conditions may be varied outside the example ranges shown in Table 1, so long as the film that results is a non-electrically conductive, high carbon film that provides a high quality barrier against HCl (or other damaging halide-containing chemistry). While examples of flow rates are described above in Table 1, in certain embodiments, the methods of the invention are used with low flow rate processes, e.g., 100-1000 sccm acetylene flow or lower. Dilution at these low flow rates may be particularly detrimental to the repeatability, so the use of low vapor pressure stabilizers is advantageous. Methods for forming high carbon content ashable hard mask materials are further discussed in the following Patents and Patent Applications, each of which is herein incorporated by reference in its entirety: U.S. Pat. No. 7,820,556; U.S. Pat. No. 7,955,990; U.S. patent application Ser. No. 14/270,001, filed May 5, 2014, and titled "SULFUR DOPED CARBON HARD MASKS"; and U.S. patent application Ser. No. 14/248,046, filed Apr. 8, 2014, and titled "HIGH SELECTIVITY AND LOW STRESS CARBON HARDMASK BY PULSED LOW FREQUENCY RF POWER."

Figure 3B:
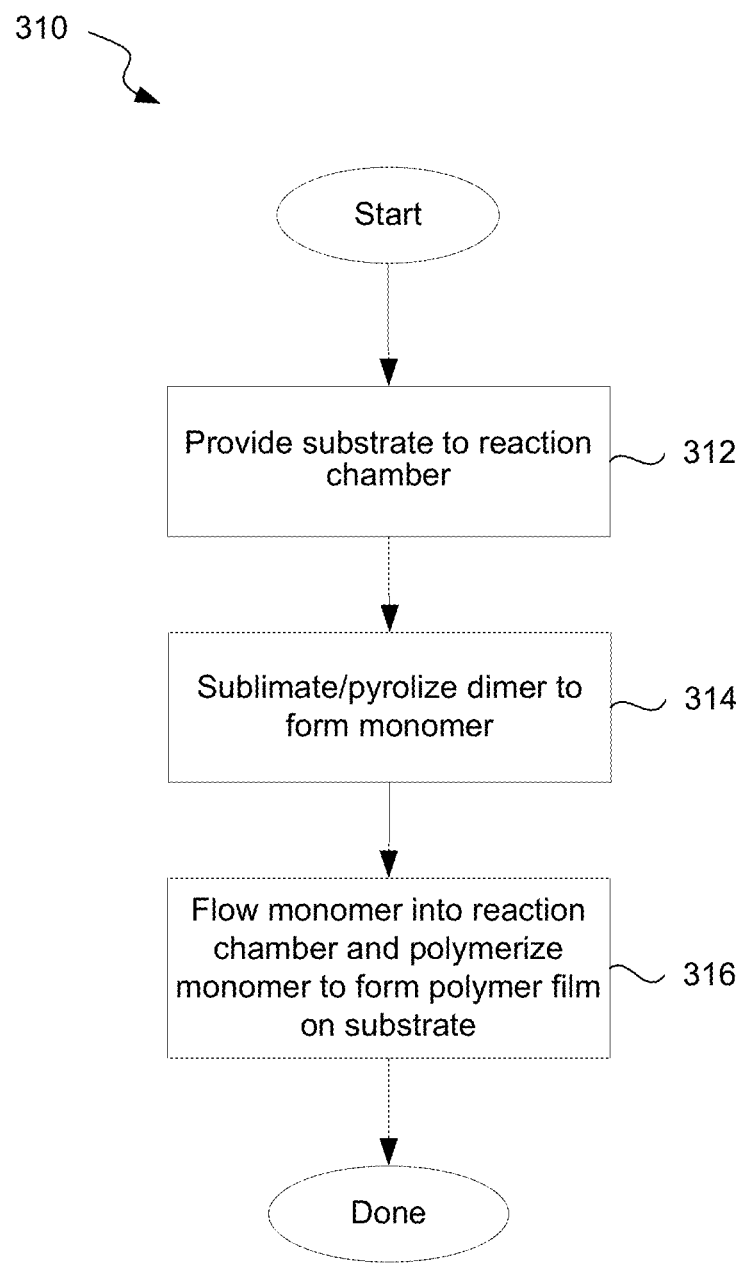
FIG. 3B presents a flowchart for a method of depositing a parylene film that may be used as a first sub-layer of a bilayer barrier layer according to various embodiments.
Figure 3C:
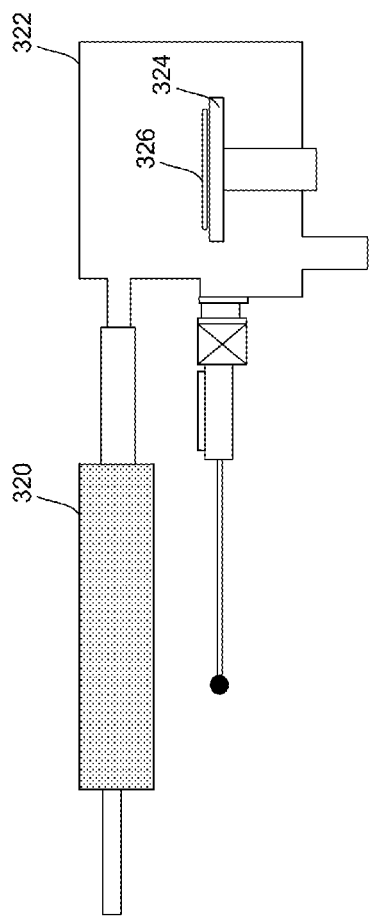
FIG. 3C illustrates a simplified view of an apparatus that may be used for forming a parylene film as described in relation to FIG. 3B.
Figure 3D:
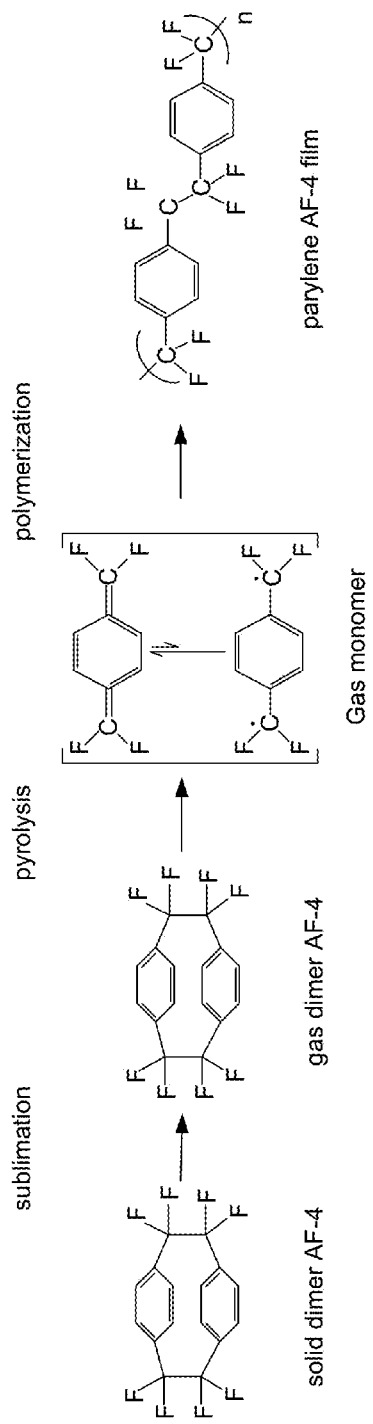
FIG. 3D depicts a reaction mechanism that may be used for forming a parylene AF-4 film as described in relation to FIG. 3B.

FIG. 3B presents a flowchart for a method of forming a parylene film, which may be used as the first sub-layer of a bilayer barrier layer. The method is explained in the context of forming parylene AF-4, though other types of parylene film may be used in some cases. FIG. 3C presents a simplified view of an apparatus that may be used to perform the method shown in FIG. 3B. FIG. 3D illustrates a reaction that may be used to form parylene AF-4 film using the method shown in FIG. 3B and the apparatus shown in FIG. 3C. The method of FIG. 3B is explained with reference to FIGS. 3C and 3D.

As shown in FIG. 3B, the method 310 begins by providing a substrate 326 to a reaction chamber 322 (block 312). The method 310 continues by sublimating a dimer (e.g., solid dimer AF-4) to form a gas phase dimer (e.g., gas dimer AF-4) and pyrolizing the gas phase dimer in a pyrolizer 320 to form gas phase monomers (block 314). Pyrolysis involves thermochemical decomposition of organic material at elevated temperatures in the absence of oxygen (and/or any halogens). Example temperatures for pyrolysis may be greater than about 400° C. Example pressures for pyrolysis may be between about 10 mT-100 T. The gas phase monomer is then fed into the reaction chamber 322 and polymerized to form a layer of polymer film (e.g., parylene AF-4 film) on the substrate, including on sidewalls of recessed features (block 316).

The reaction chamber 322 may house the substrate 326 on a substrate support pedestal 324. The substrate support pedestal may maintain the substrate at a particular temperature, for example greater than about 400° C. The reaction chamber may be maintained at a pressure between about 10 mT-100 T. Before formation of the polymer film, the substrate 322 may have exposed material that is sensitive to HCl or other damaging halide-containing chemistry (e.g., a chalcogenide layer, a copper layer, an aluminum layer, etc.). After formation of the parylene AF-4 film, deposition of the first sub-layer of the bilayer barrier layer is complete and the second sub-layer may be deposited. As with the method described above, the first sub-layer may be deposited to a thickness between about 15-100 Å, for example between about 20-50 Å. In many cases the first sub-layer is at least about 20 Å thick. The upper bound on the thickness of the first sub-layer may be dependent upon the aspect ratio of features on the substrate (if such features are present) and whether such features are to be completely filled with the second sub-layer (e.g., SiN) or merely lined with the second sub-layer and later filled with another material such as an oxide.

Where the first sub-layer is a parylene film other than parylene AF-4, other dimers may be used. Similarly, other reaction parameters (temperatures, pressures, etc.) may be used as appropriate for forming the relevant parylene film.

Figure 3E:
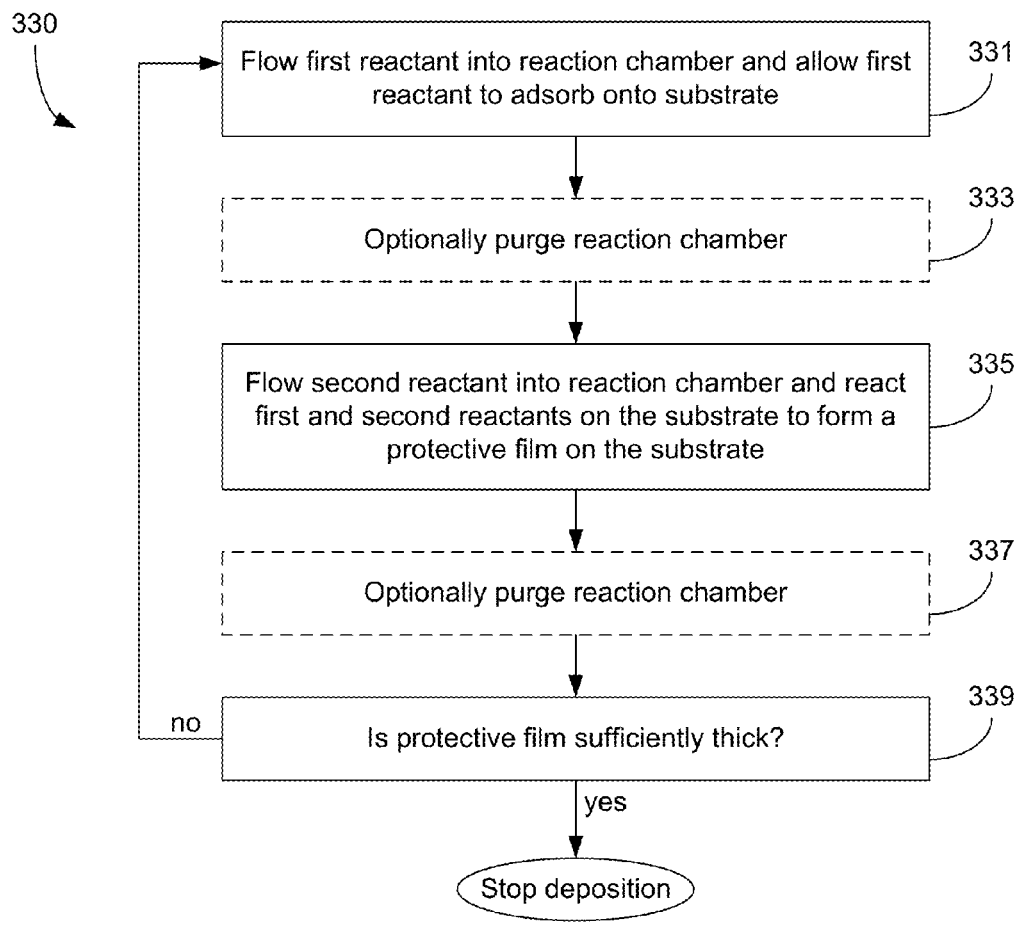
FIG. 3E presents a flowchart for a method of forming a film (e.g., a first sub-layer of a bilayer barrier layer) through a molecular layer deposition method.

FIG. 3E presents a flowchart for a method of forming an organic polymeric film using a molecular layer deposition (MLD) method. In some embodiments, this method may be used to form the first sub-layer of a bilayer barrier layer. MLD methods may deposit thin films of organic polymer using ALD-like cycles involving two half-reactions. In some cases MLD methods may be driven in a less adsorption-limited manner than conventional ALD methods. For example, certain MLD methods may utilize under- or over-saturation of reactants. ALD and MLD methods are particularly well suited for forming conformal films that line the sidewalls of the features in certain embodiments. MLD methods are further discussed in the following U.S. Patent Applications, each of which is herein incorporated by reference in its entirety: U.S. patent application Ser. No. 14/446,427, filed Jul. 30, 2014, and titled "METHOD OF CONDITIONING VACUUM CHAMBER OF SEMICONDUCTOR SUBSTRATE PROCESSING APPARATUS"; and U.S. patent application Ser. No. 14/724,574, filed May 25, 2015, and titled "TECHNIQUE TO DEPOSIT SIDEWALL PASSIVATION FOR HIGH ASPECT RATIO CYLINDER ETCH."

The method 330 begins with operation 331, where a first reactant is flowed into the reaction chamber and adsorbs onto the substrate surface. The reactant may penetrate deep into a partially etched feature and adsorb onto the sidewalls of the feature. The first reactant forms an adsorbed layer. In some implementations, the first reactant is an organometallic material. In certain embodiments the organometallic material includes aluminum. One example of an aluminum-containing organometallic material that may be used as a first reactant is trimethylaluminum (TMA). In some other cases the organometallic material may be a tungsten-containing material, for example WCN. Many other organometallic materials may be used, as well. In some implementations, the first reactant may be an acid anhydride. One example of a suitable acid anhydride is maleic anhydride. The first reactant may be provided along with an inert carrier gas (e.g., nitrogen, argon, helium, neon, etc.) The duration over which the first reactant flows may be between about 0.1-20 sec.

Next, at operation 333, the reaction chamber may be optionally purged to remove excess first reactant from the reaction chamber. Next, at operation 335, the second reactant is delivered to the reaction chamber. Example durations for operation 335 may be between about 0.1-20 sec. In some embodiments the second reactant may be a diamine, a diol, a thiol, or a trifunctional compound. In a particular embodiment the second reactant may be ethylene glycol and/or ethanolamine. The second reactant reacts with the first reactant to form a protective film on the substrate. In one particular example, the first reactant is a metalorganic material (e.g., TMA or others) and the second reactant is ethylene glycol. In another particular example, the first reactant is an acid anhydride (e.g., maleic anhydride or others) and the second reactant is ethanolamine. Such reactant combinations have been shown to result in films that provide a high quality barrier to HCl. The polymeric film may form through a thermal reaction, without reliance on any plasma. In some embodiments, the substrate may be maintained at a temperature between about 25-250° C. during formation of the polymeric film. During formation of the polymeric film, the reaction chamber used to deposit the film may be maintained at a pressure between about 0.5-10 Torr.

Next, at operation 337, the reaction chamber may be optionally purged. The purges in operations 333 and 337 may occur by sweeping the reaction chamber with a non-reactive gas, evacuating the reaction chamber, or some combination thereof. The purpose of the purges is to remove any non-adsorbed reactants and byproducts from the reaction chamber. While the purge operations 333 and 337 are both optional, they may help prevent unwanted gas phase reactions, and may result in improved deposition results.

Next, at operation 339, it is determined whether the polymeric film is sufficiently thick. Such a determination may be made based on the thickness deposited per cycle and the number of cycles performed. In various embodiments, each cycle deposits between about 0.1-1 nm of film, with the thickness dependent upon the length of time that the reactants are flowed into the reaction chamber and the resulting level of reactant saturation. If the film is not yet sufficiently thick, the method 330 repeats from operation 331 to build additional film thickness by depositing additional layers. Otherwise, the method 330 is complete. In subsequent iterations, operation 331 may involve both adsorbing additional first reactant onto the substrate, and reaction of the first reactant with the second reactant, which may be present due to a previous iteration of operation 335. In other words, after the first cycle, both operations 331 and 335 may involve a reaction between the first and second reactants.

As noted above, the first sub-layer of the bilayer barrier layer is often a high carbon film. The method used to form the high carbon film is not limited to the methods described in relation to FIGS. 3A-3E.

Formation of Second Sub-Layer in Bilayer Barrier Layer

The second sub-layer of the bilayer barrier layer forms on the first sub-layer. The second sub-layer provides protection against oxidization for the underlying materials. In various embodiments, the second sub-layer is deposited through vapor deposition methods such as chemical vapor deposition (CVD) or atomic layer deposition (ALD), either of which may be practiced using thermal energy and/or plasma to drive the deposition reaction. In a number of cases, the second sub-layer is SiN, though other materials may be used as appropriate.

Figure 4A:
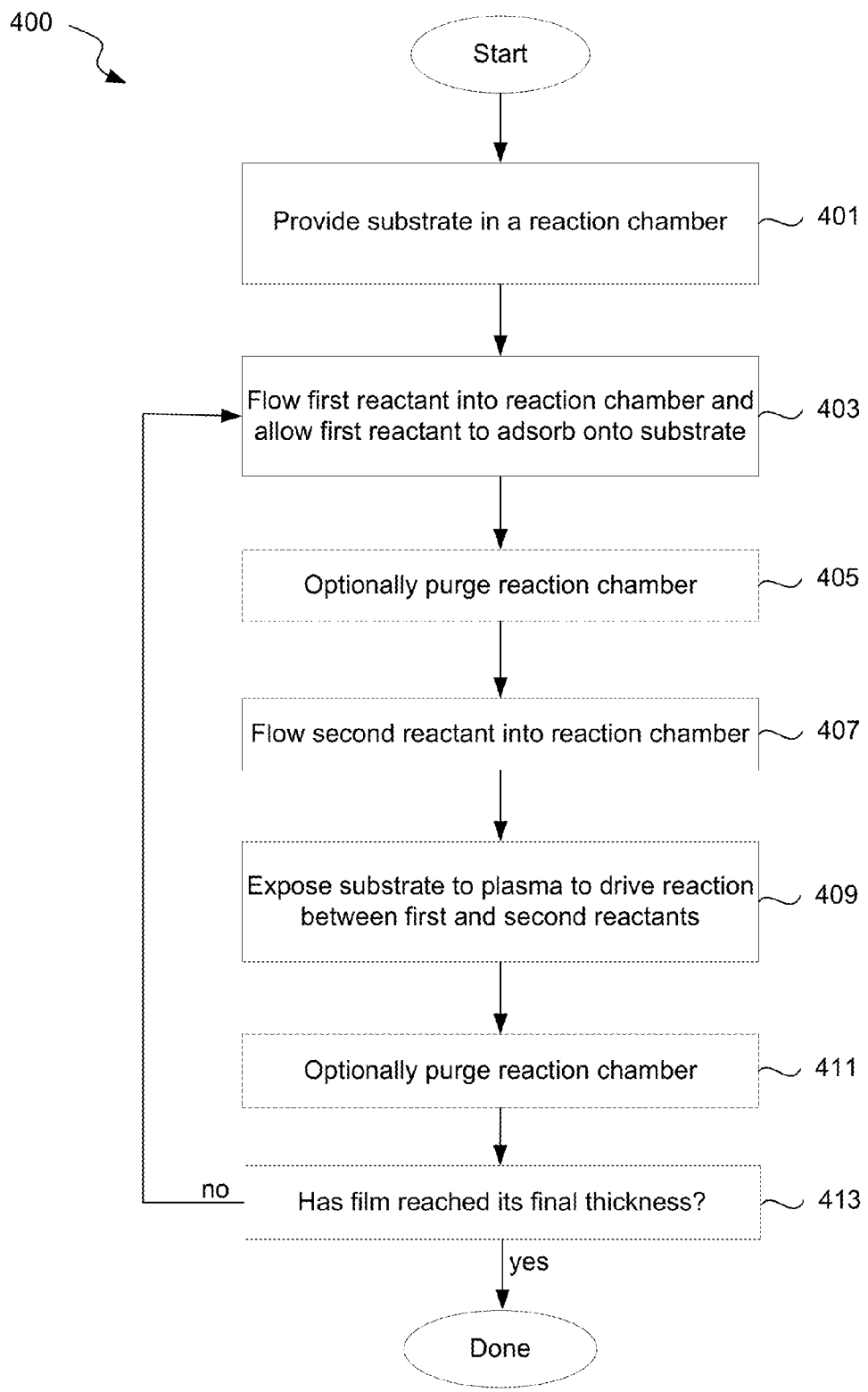
FIG. 4A presents a flowchart for a method of depositing a film (e.g., a second sub-layer of a bilayer barrier layer) through an atomic layer deposition method.

FIG. 4A presents a flowchart for a method 400 of depositing material using plasma assisted atomic layer deposition. The method 400 is described in the context of forming SiN, though other materials may be formed where suitable reactants and reaction conditions are provided. In some cases, the method 400 may be carried out in a reaction chamber from the Vector® product family, available from Lam Research Corporation of Fremont, Calif. Examples of apparatus that may be used to perform the method 400 are presented in FIGS. 5-7.

The method 400 begins by providing a substrate to a reaction chamber (block 401). The substrate may be maintained at a temperature between about 50-400° C. The reaction chamber may be maintained at a pressure between about 0.1-100 T. Next, a first reactant is flowed into the reaction chamber and allowed to adsorb onto the surface of the substrate (block 403). In various implementations, the first reactant may be a halide-containing reactant, for example a chlorine-containing reactant. The first reactant may also be a silicon-containing reactant in many cases. In a particular example the first reactant is dichlorosilane (DCS). Example flow rates for the first reactant may be between about 0.25-5 L/min (flow rate to a single station/substrate). The first reactant may be provided along with an inert carrier gas. The duration over which the first reactant is provided may be between about 0.1-20 sec. The reaction chamber may then be optionally purged (block 405). The purge may occur by evacuating the chamber, sweeping the chamber with inert gas, or some combination thereof.

After the flow of the first reactant has ceased, and after the reaction chamber has been optionally purged, a second reactant is flowed into the reaction chamber and reacts with the first reactant to form a film (block 407). In a number of embodiments, the second reactant is a nitrogen-containing reactant. The second reactant may also be a hydrogen-containing reactant in many cases. One example second reactant is ammonia. Example flow rates for the second reactant may be between about 0.25-20 L/min (flow rate to a single station/substrate). The second reactant may be provided along with an inert carrier gas. The duration over which the second reactant flows may be between about 0.1-20 sec. In some implementations, the second reactant may flow continuously to the substrate.

The reaction chamber may be exposed to plasma to drive a reaction between the first and second reactants (block 409) to form the desired film. This film is the second sub-layer of the bilayer barrier layer. Delivery of the second reactant in block 407 may occur either before the plasma exposure in block 409, or concurrently with the plasma exposure in block 409. In many embodiments, the plasma is a capacitively coupled plasma. However, other types of plasma may also be used, for example inductively coupled plasmas. Various types of plasma generators may be used including RF, DC and microwave plasma generators. Both single-frequency plasmas and dual-frequency plasmas may be used. In some cases, the plasma may be generated using a low frequency (LF) component between about 25-1000 W (power to a single station/substrate) provided at a frequency between about 50-400 Hz, which may correspond to a power density between about 350-14,500 $W/m^2$ (considering the setpoint power and the area of the substrate(s), and not considering losses from efficiency/delivery). In these or other cases, the plasma may be generated using a high frequency (HF) component between about 25-5000 W (power to a single station/substrate) provided at a frequency between about 2-60 Hz, for example about 13.56 Hz, or about 27 Hz in some cases, which may correspond to a power density between about 350-70,000 $W/m^2$ (considering the setpoint power and the area of the substrate(s), and not considering losses from efficiency/delivery).

In a number of cases, the first reactant and second reactant react with one another to form (in addition to the desired film) an undesired halide-containing species. For example, where the first reactant is DCS and the second reactant is ammonia, the chlorine from the DCS may combine with the hydrogen from the ammonia to form HCl. Where no first sub-layer is present to act as a halide-blocking layer, this HCl can damage various materials on the partially fabricated device.

After delivery of the second reactant, the reaction chamber may be optionally purged (block 411). This purge may occur by evacuating the reaction chamber, sweeping the reaction chamber, or a combination thereof. The film thickness can then be compared to a final desired film thickness (block 413). Blocks 403-413 constitute a single ALD cycle. If the film is not yet sufficiently thick at block 413, the method continues by repeating the ALD cycle, starting with block 403. This cycle may be repeated until the deposited film reaches a desired thickness, at which point the method is complete. ALD and related methods for forming conformal films are further described in U.S. Pat. No. 8,728,956, which is herein incorporated by reference in its entirety.

Figure 4B:
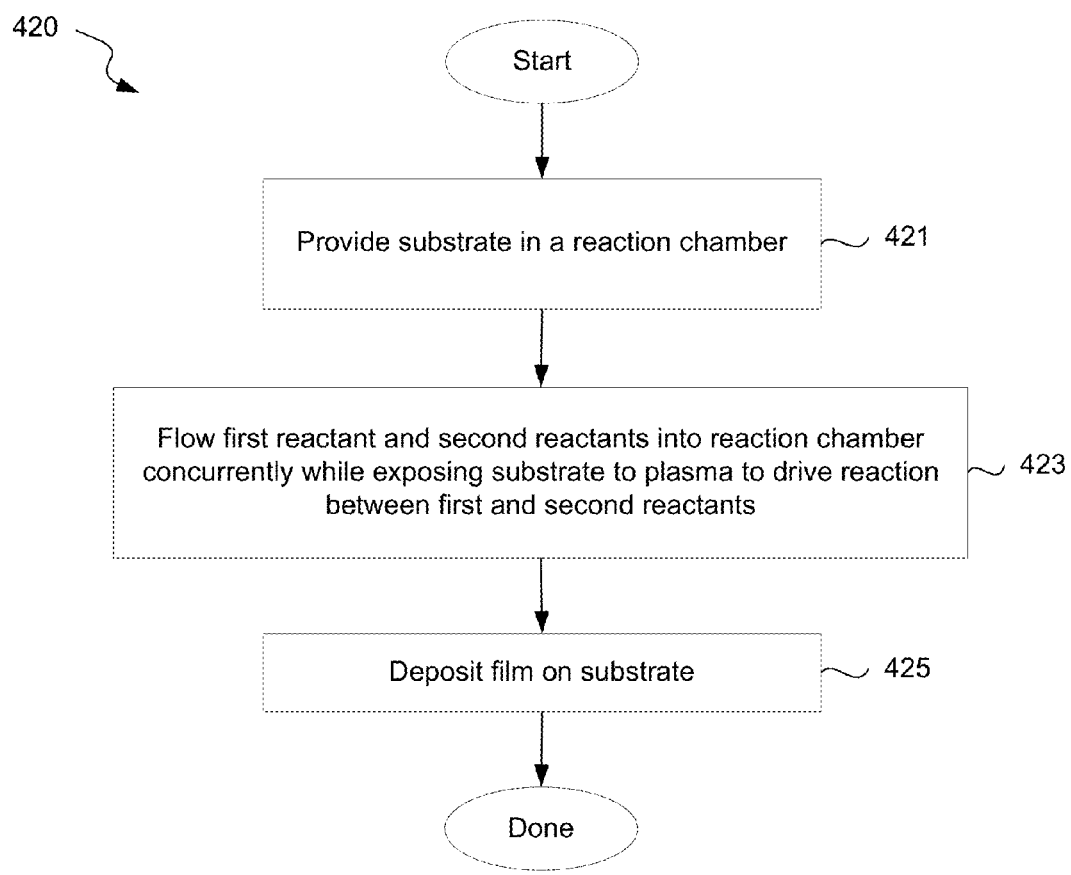
FIG. 4B presents a flowchart for a method of depositing a film (e.g., a second sub-layer of a bilayer barrier layer) through a chemical vapor deposition method.

FIG. 4B presents a flowchart for a method 420 of depositing material using plasma assisted chemical vapor deposition. The method 420 is presented in the context of forming SiN, though other materials may be used in some cases. The method 420 begins by introducing a substrate into a reaction chamber (block 421). Next, a first and second reactant are flowed into the reaction chamber concurrently (block 423). In this example, the first reactant may be dichlorosilane and the second reactant may be ammonia. The first and/or second reactants may have the properties described above in relation to FIG. 4A, and may result in formation of HCl or another damaging halide-containing species. Many different reactants may be used, including one or more catalysts. The first sub-layer (which is below the second sub-layer) protects the underlying materials from exposure to the damaging halide-containing species. While the reactants are being flowed, the reaction chamber is exposed to plasma to drive a reaction between the first and second reactants (block 423). The reaction may be a gas phase reaction that deposits a reaction product on the surface of the substrate (block 425). The operations shown in blocks 423 and 425 may occur substantially concurrently.

Regardless of how the sub-layer is deposited, example thicknesses for the second sub-layer may be between about 15-10,000 Å (limited by line width), in some cases between about 15-50 Å. In various cases the second sub-layer is at least about 15 Å thick, for example at least about 20 Å thick. The upper bound of the thickness of the second sub-layer may depend upon the aspect ratio of any recessed features on the substrate, as well as whether such features are to be completely filled with nitride or merely lined with nitride and later filled with another material such as an oxide. In some embodiments, the first and second sub-layers may have a combined thickness between about 30-10,000 Å.

The first and second sub-layers may be deposited in the same reaction chamber in some cases. This may be particularly useful in cases where the first and second sub-layers are deposited through chemical vapor deposition and/or atomic layer deposition techniques. Using a single reaction chamber to deposit both sub-layers may be advantageous in that there is no need to transfer the substrate between the deposition operations, reducing the likelihood of undesirably oxidizing the underlying materials. Using two different reaction chambers to deposit the sub-layers may be advantageous in that each chamber can be optimized to deposit one of the sub-layers. This may also reduce contamination, forming higher quality films that have better adhesion and particulate performance. In some implementations, the methods described herein may be performed on a cluster tool that includes multiple reaction chambers. One reaction chamber may be used to deposit the first sub-layer and a second reaction chamber may be used to deposit the second sub-layer. A vacuum transfer chamber may be provided such that the substrate can be transferred between reaction chambers without breaking vacuum (and therefore, without exposing the substrate to atmosphere). In some embodiments, a cluster tool may be further equipped with a reaction chamber configured to perform etching. The reaction chamber configured to perform etching may be used to accomplish various etching operations as described in relation to FIGS. 1A-1E and 2A-2F.

Apparatus

The methods described herein may be performed by any suitable apparatus. A suitable apparatus includes hardware for accomplishing the process operations and a system controller having instructions for controlling process operations in accordance with the present invention. For example, in some embodiments, the hardware may include one or more process stations included in a process tool.

FIG. 5 schematically shows an embodiment of a process station 500 that may be used to deposit material using atomic layer deposition (ALD) and/or chemical vapor deposition (CVD), either of which may be plasma enhanced. For simplicity, the process station 500 is depicted as a standalone process station having a process chamber body 502 for maintaining a low-pressure environment. However, it will be appreciated that a plurality of process stations 500 may be included in a common process tool environment. Further, it will be appreciated that, in some embodiments, one or more hardware parameters of process station 500, including those discussed in detail below, may be adjusted programmatically by one or more computer controllers.

Process station 500 fluidly communicates with reactant delivery system 501 for delivering process gases to a distribution showerhead 506. Reactant delivery system 501 includes a mixing vessel 504 for blending and/or conditioning process gases for delivery to showerhead 506. One or more mixing vessel inlet valves 520 may control introduction of process gases to mixing vessel 504. Similarly, a showerhead inlet valve 505 may control introduction of process gasses to the showerhead 506.

Some reactants, like BTBAS, may be stored in liquid form prior to vaporization at and subsequent delivery to the process station. For example, the embodiment of FIG. 5 includes a vaporization point 503 for vaporizing liquid reactant to be supplied to mixing vessel 504. In some embodiments, vaporization point 503 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 503 may be heat traced. In some examples, mixing vessel 504 may also be heat traced. In one non-limiting example, piping downstream of vaporization point 503 has an increasing temperature profile extending from approximately 100° C. to approximately 150° C. at mixing vessel 504.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 503. In one scenario, a liquid injector may be mounted directly to mixing vessel 504. In another scenario, a liquid injector may be mounted directly to showerhead 506.

In some embodiments, a liquid flow controller upstream of vaporization point 503 may be provided for controlling a mass flow of liquid for vaporization and delivery to process station 500. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 506 distributes process gases toward substrate 512. In the embodiment shown in FIG. 5, substrate 512 is located beneath showerhead 506, and is shown resting on a pedestal 508. It will be appreciated that showerhead 506 may have any suitable shape, and may have any suitable number and arrangement of ports for distributing processes gases to substrate 512.

In some embodiments, a microvolume 507 is located beneath showerhead 506. Performing an ALD and/or CVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 508 may be raised or lowered to expose substrate 512 to microvolume 507 and/or to vary a volume of microvolume 507. For example, in a substrate transfer phase, pedestal 508 may be lowered to allow substrate 512 to be loaded onto pedestal 508. During a deposition process phase, pedestal 508 may be raised to position substrate 512 within microvolume 507. In some embodiments, microvolume 507 may completely enclose substrate 512 as well as a portion of pedestal 508 to create a region of high flow impedance during a deposition process.

Optionally, pedestal 508 may be lowered and/or raised during portions the deposition process to modulate process pressure, reactant concentration, etc., within microvolume 507. In one scenario where process chamber body 502 remains at a base pressure during the deposition process, lowering pedestal 508 may allow microvolume 507 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another scenario, adjusting a height of pedestal 508 may allow a plasma density to be varied during plasma activation and/or treatment cycles included in the deposition process. At the conclusion of the deposition process phase, pedestal 508 may be lowered during another substrate transfer phase to allow removal of substrate 512 from pedestal 508.

While the example microvolume variations described herein refer to a height-adjustable pedestal, it will be appreciated that, in some embodiments, a position of showerhead 506 may be adjusted relative to pedestal 508 to vary a volume of microvolume 507. Further, it will be appreciated that a vertical position of pedestal 508 and/or showerhead 506 may be varied by any suitable mechanism within the scope of the present disclosure. In some embodiments, pedestal 508 may include a rotational axis for rotating an orientation of substrate 512. It will be appreciated that, in some embodiments, one or more of these example adjustments may be performed programmatically by one or more suitable computer controllers.

Returning to the embodiment shown in FIG. 5, showerhead 506 and pedestal 508 electrically communicate with RF power supply 514 and matching network 516 for powering a plasma. In some embodiments, the plasma energy may be controlled by controlling one or more of a process station pressure, a gas concentration, an RF source power, an RF source frequency, and a plasma power pulse timing. For example, RF power supply 514 and matching network 516 may be operated at any suitable power to form a plasma having a desired composition of radical species. Examples of suitable powers are included above. Likewise, RF power supply 514 may provide RF power of any suitable frequency. In some embodiments, RF power supply 514 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations, much shorter plasma strikes may be used. These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

In some embodiments, pedestal 508 may be temperature controlled via heater 510. Further, in some embodiments, pressure control for deposition process station 500 may be provided by butterfly valve 518. As shown in the embodiment of FIG. 5, butterfly valve 518 throttles a vacuum provided by a downstream vacuum pump (not shown). However, in some embodiments, pressure control of process station 500 may also be adjusted by varying a flow rate of one or more gases introduced to process station 500.

FIG. 6 shows a schematic view of an embodiment of a multi-station processing tool 600 with an inbound load lock 602 and an outbound load lock 604, either or both of which may comprise a remote plasma source. A robot 606, at atmospheric pressure, is configured to move wafers from a cassette loaded through a pod 608 into inbound load lock 602 via an atmospheric port 610. A wafer is placed by the robot 606 on a pedestal 612 in the inbound load lock 602, the atmospheric port 610 is closed, and the load lock is pumped down. Where the inbound load lock 602 comprises a remote plasma source, the wafer may be exposed to a remote plasma treatment in the load lock prior to being introduced into a processing chamber 614. Further, the wafer also may be heated in the inbound load lock 602 as well, for example, to remove moisture and adsorbed gases. Next, a chamber transport port 616 to processing chamber 614 is opened, and another robot (not shown) places the wafer into the reactor on a pedestal of a first station shown in the reactor for processing. While the embodiment depicted in FIG. 4 includes load locks, it will be appreciated that, in some embodiments, direct entry of a wafer into a process station may be provided.

The depicted processing chamber 614 comprises four process stations, numbered from 1 to 4 in the embodiment shown in FIG. 6. Each station has a heated pedestal (shown at 618 for station 1), and gas line inlets. It will be appreciated that in some embodiments, each process station may have different or multiple purposes. While the depicted processing chamber 614 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 also depicts an embodiment of a wafer handling system 690 for transferring wafers within processing chamber 614. In some embodiments, wafer handling system 690 may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog and/or digital input/output connections, stepper motor controller boards, etc.

In some embodiments, system controller 650 controls all of the activities of process tool 600. System controller 650 executes system control software 658 stored in mass storage device 654, loaded into memory device 656, and executed on processor 652. System control software 658 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 600. System control software 658 may be configured in any suitable way. For example, various process tool component subroutines or control objects may be written to control operation of the process tool components necessary to carry out various process tool processes in accordance with the disclosed methods. System control software 658 may be coded in any suitable computer readable programming language.

In some embodiments, system control software 658 may include input/output control (IOC) sequencing instructions for controlling the various parameters described above. For example, each phase of a PEALD process may include one or more instructions for execution by system controller 650. The instructions for setting process conditions for a PEALD process phase may be included in a corresponding PEALD recipe phase. In some embodiments, the PEALD recipe phases may be sequentially arranged, so that all instructions for a PEALD process phase are executed concurrently with that process phase.

Other computer software and/or programs stored on mass storage device 654 and/or memory device 656 associated with system controller 650 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 618 and to control the spacing between the substrate and other parts of process tool 600.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 650. The user interface may include a display screen, graphical software displays of the apparatus and/or process conditions, and user input devices such as pointing devices, keyboards, touch screens, microphones, etc.

In some embodiments, parameters adjusted by system controller 650 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, Calif., or any of a variety of other commercially available processing systems. Two or more of the stations may perform the same functions. Similarly, two or more stations may perform different functions. Each station can be designed/configured to perform a particular function/method as desired.

FIG. 7 is a block diagram of a processing system suitable for conducting thin film deposition processes in accordance with certain embodiments. The system 700 includes a transfer module 703. The transfer module 703 provides a clean, pressurized environment to minimize risk of contamination of substrates being processed as they are moved between various reactor modules. Mounted on the transfer module 703 are two multi-station reactors 709 and 710, each capable of performing atomic layer deposition (ALD) and/or chemical vapor deposition (CVD) according to certain embodiments. Reactors 709 and 710 may include multiple stations 711, 713, 715, and 717 that may sequentially or non-sequentially perform operations in accordance with disclosed embodiments. The stations may include a heated pedestal or substrate support, one or more gas inlets or showerhead or dispersion plate.

Also mounted on the transfer module 703 may be one or more single or multi-station modules 707 capable of performing plasma or chemical (non-plasma) pre-cleans, or any other processes described in relation to the disclosed methods. The module 707 may in some cases be used for various treatments to, for example, prepare a substrate for a deposition process. The module 707 may also be designed/configured to perform various other processes such as etching or polishing. In certain implementations, a first sub-layer of a bilayer barrier layer may be deposited in reactor 709, a second sub-layer of a bilayer barrier layer may be deposited in reactor 710, and module 707 may be used for etching. In this example, all of the processes described in relation to FIGS. 1A-1E and 2A-2F may be accomplished in the processing system 700. This multi-functional/multi-tool system may be particularly useful for fabricating PCRAM and other devices under a controlled atmosphere.

The system 700 also includes one or more wafer source modules 701, where wafers are stored before and after processing. An atmospheric robot (not shown) in the atmospheric transfer chamber 719 may first remove wafers from the source modules 701 to loadlocks 721. A wafer transfer device (generally a robot arm unit) in the transfer module 703 moves the wafers from loadlocks 721 to and among the modules mounted on the transfer module 703.

In various embodiments, a system controller 729 is employed to control process conditions during deposition. The controller 729 will typically include one or more memory devices and one or more processors. A processor may include a CPU or computer, analog and/or digital input/output connections, stepper motor controller boards, etc.

The controller 729 may control all of the activities of the deposition apparatus. The system controller 729 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 729 may be employed in some embodiments.

Typically there will be a user interface associated with the controller 729. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 729. The signals for controlling the process are output on the analog and digital output connections of the deposition apparatus 700.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller 729 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 729, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

EXPERIMENTAL

Experimental results have shown that the described bilayer barrier layer approach can be used to protect halide-sensitive materials from damage and also protect against oxidation. The experimental results suggest that the disclosed methods are particularly useful in the context of forming a PCRAM device, though the embodiments are not so limited.

Figures 8, 9:
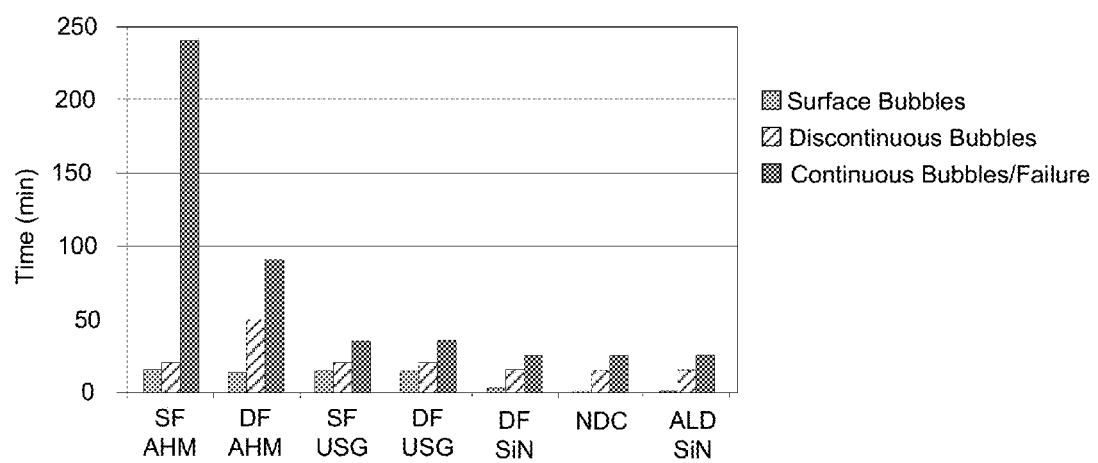
FIG. 8 presents a table showing leakage current and breakdown voltage for different films that were tested.
FIG. 9 shows a graph illustrating the results of an HCl bubble test for different types of film that were tested.

With respect to the first sub-layer of the bilayer barrier layer, several types of film were explored. Various high carbon content films were shown to provide high quality protection against damage from HCl. For example, a conformal carbon layer was deposited using PECVD methods (as described above in relation to forming ashable hard mask materials, e.g., FIG. 3A). The deposited film was substantially conformal, with a 1-sigma thickness non-uniformity of less than 2.5%. The 1-sigma thickness non-uniformity is calculated using spectroscopic ellipsometry. The thickness non-uniformity is calculated based on a map pattern of the film thickness, looking at 49 (or more) points on the substrate. The outer 3 mm of the substrate is excluded from consideration. Within the 49 (or more) points, an average thickness is calculated, as well as the standard deviation. The 1-sigma thickness non-uniformity is calculated as 100*(standard deviation of thicknesses)/(average thickness). In various cases, the thickness non-uniformity of the first sub-layer may be about 2% or lower. The refractive index of the deposited film was about 1.61 at 633 nm. The film formed was non-conductive, having low leakage and a high breakdown voltage. Example leakage currents and breakdown voltages are shown in FIG. 8. Four samples (1-4) are shown. Each sample was formed at about 250° C. using PECVD. In various embodiments, the first sub-layer may have a breakdown voltage (e.g., the field voltage at which leakage reaches 0.001 A/cm$^2$) having a magnitude of at least about 4 MV/cm.

FIG. 9 presents experimental results related to an HCl bubble test performed on a number of different types of film. This test was done to evaluate the different materials with respect to their ability to withstand exposure to HCl. In other words, this test evaluates how well a material (e.g., a first sub-layer material) is expected to protect underlying materials from damage arising from exposure to HCl. The HCl bubble test involved depositing the various films on aluminum coupons provided on bare silicon wafer carriers. After deposition, each film was submerged in a solution including 5% HCl and 95% H$_2$O (by volume). The films were monitored for signs of bubble formation. Bubbles form as a result of reaction between the HCl and the underlying aluminum material. Three different times were recorded for each film including (1) the time at which bubbles first appeared on the surface of the film, (2) the time at which bubbles began discontinuously rising from the film, and (3) the time at which a steady stream of bubbles began rising from the film. This third time was defined as the failure condition. Longer timeframes suggest films that are more resistant to HCl.

The films tested with respect to FIG. 9 include (1) an ashable hard mask carbon material deposited using a single frequency RF PECVD process (referred to as "SF AHM"), (2) an ashable hard mask carbon material deposited using a dual frequency RF PECVD process (referred to as "DF AHM"), (3) undoped silicate glass deposited using a single frequency RF PECVD process (referred to as "SF USG"), (4) undoped silicate glass deposited using a dual frequency RF PECVD process (referred to as "DF USG"), (5) a silicon nitride material deposited using a dual frequency RF PECVD process (referred to as "DF SiN"), (6) a silicon carbonitride material deposited using a PECVD process (referred to as "NDC"), and (7) a silicon nitride material deposited through an ALD process (referred to as "ALD SiN").

As shown in FIG. 9, the single frequency and dual frequency ashable hard mask materials showed the best resistance to HCl. These high carbon content materials therefore provide a high quality barrier against damage due to exposure to HCl. The single frequency ashable hard mask material performed particularly well, with failure occurring after about 240 minutes. Without wishing to be bound by theory or mechanism of action, it is believed that the single frequency PECVD AHM film was more resistant to HCl than the dual frequency PECVD AHM film because single frequency films tend to be less dense, have a higher hydrogen content, and have less SP3 bonding compared to dual frequency films.

What is claimed is:

1. A method of depositing a bilayer barrier layer on a partially fabricated semiconductor device, the method comprising:
(a) providing a substrate comprising a first layer of halide-sensitive material, the first layer of halide-sensitive material being at least partially exposed when provided in (a); and
(b) depositing the bilayer barrier layer by:
(i) depositing a first sub-layer of the bilayer barrier layer on the substrate, the first sub-layer comprising at least about 40 weight % carbon, the first sub-layer of the bilayer barrier layer being deposited on exposed portions of the first layer of halide-sensitive material, and
(ii) depositing a second sub-layer of the bilayer barrier layer on the first sub-layer of the bilayer barrier layer, the second sub-layer of the bilayer barrier layer comprising silicon nitride, wherein the second sub-layer of the bilayer barrier layer is deposited using halide-containing chemistry, wherein during deposition of the second sub-layer of the bilayer barrier layer, the first sub-layer of the bilayer barrier layer protects the first layer of halide-sensitive material from the halide-containing chemistry.

2. The method of claim 1, wherein the first layer of halide-sensitive material comprises a chalcogenide material.

3. The method of claim 1, wherein the first sub-layer of the bilayer barrier layer comprises amorphous carbon deposited through a chemical vapor deposition process.

4. The method of claim 1, wherein the first sub-layer of the bilayer barrier layer comprises a parylene material deposited through a process involving pyrolysis and polymerization.

5. The method of claim 4, wherein the parylene material comprises parylene AF-4.

6. The method of claim 1, wherein (b)(ii) comprises depositing the second sub-layer of the bilayer barrier layer through an atomic layer deposition process.

7. The method of claim 1, wherein (b)(ii) comprises depositing the second sub-layer of the bilayer barrier layer through a chemical vapor deposition process.

8. The method of claim 1, wherein the substrate comprises a second layer of halide-sensitive material positioned below the first layer of halide-sensitive material, and further comprising:
(c) after (b)(ii), etching the substrate in a manner that exposes portions of the second layer of halide-sensitive material but not the first layer of halide-sensitive material, the first layer of halide-sensitive material remaining covered at least partially by the bilayer barrier layer;
(d) depositing a second bilayer barrier layer on the substrate by:
(i) depositing a first sub-layer of the second bilayer barrier layer on the substrate, the first sub-layer of the second bilayer barrier layer comprising at least about 40 weight % carbon, the first sub-layer of the second bilayer barrier layer being deposited on exposed portions of the second layer of halide-sensitive material, and
(ii) depositing a second sub-layer of the second bilayer barrier layer on the first sub-layer of the second bilayer barrier layer, the second sub-layer of the second bilayer barrier layer comprising silicon nitride, wherein the second sub-layer of the second bilayer barrier layer is deposited using halide-containing chemistry in an atomic layer deposition process, wherein during deposition of the second sub-layer of the second bilayer barrier layer, the first sub-layer of the second bilayer barrier layer protects the second layer of halide-sensitive material from the halide-containing chemistry.

9. The method of claim 1, wherein the first sub-layer of the bilayer barrier layer is deposited to a thickness between about 15-100 Å thick, and wherein the second sub-layer of the bilayer barrier layer is deposited to a thickness of at least about 20 Å.

10. The method of claim 1, wherein the halide-containing chemistry comprises a chlorosilane.

11. The method of claim 10, wherein the chlorosilane is dichlorosilane.

12. The method of claim 1, wherein the method is performed in the context of forming a phase change memory device.

13. The method of claim 3, wherein the first sub-layer of the bilayer barrier layer is formed through a plasma enhanced chemical vapor deposition process that involves exposing the substrate to a plasma, the plasma being generated using a single RF frequency.

14. The method of claim 13, wherein the RF frequency used to generate the plasma is a high frequency (HF) RF frequency.

15. The method of claim 1, wherein the first sub-layer of the bilayer barrier layer is deposited in a reaction chamber, and wherein the second sub-layer of the bilayer barrier layer is deposited in the same reaction chamber.

16. The method of claim 1, wherein the first sub-layer of the bilayer barrier layer is deposited in a first reaction chamber and the second sub-layer of the bilayer barrier layer is deposited in a second reaction chamber, the first and second reaction chambers being provided together on a multi-chamber tool.

17. The method of claim 16, further comprising transferring the substrate from the first reaction chamber to the second reaction chamber under vacuum conditions.

18. The method of claim 1, wherein the first and second sub-layers of the bilayer barrier layer are conformally deposited such that for each of the first and second sub-layers, the thinnest portion of the sub-layer is at least about 60% the thickness of the thickest portion of the sub-layer.

19. The method of claim 2, wherein the chalcogenide material is sandwiched between layers of carbon.

\* \* \* \* \*